US006479194B1

(12) United States Patent
Talor, Jr.

(10) Patent No.: US 6,479,194 B1
(45) Date of Patent: Nov. 12, 2002

(54) TRANSPARENT PHASE SHIFT MASK FOR FABRICATION OF SMALL FEATURE SIZES

(75) Inventor: George Talor, Jr., Rancho Santa Margorita, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/499,244

(22) Filed: Feb. 7, 2000

(51) Int. Cl.[7] ................................................ G03F 9/00
(52) U.S. Cl. ......................................................... 430/5
(58) Field of Search .............................. 430/5; 716/19, 716/21; 250/492.22, 492.2

(56) References Cited

U.S. PATENT DOCUMENTS

| 5,362,591 A | | 11/1994 | Imai et al. | |
|---|---|---|---|---|
| 5,472,811 A | * | 12/1995 | Vasudev et al. | 430/5 |
| 5,633,102 A | | 5/1997 | Toh et al. | |
| 6,251,549 B1 | * | 6/2001 | Levenson | 430/5 |
| 6,258,493 B1 | * | 7/2001 | Wang et al. | 430/5 |

OTHER PUBLICATIONS

Brock P. J., et al: "Fabrication of Grooved Glass Substrates by Phase Mask Lithography," Journal of Vacuum Science and Technology: Part B, US, American Institute of Physics, New York, vol. 9, No. 6, Nov. 1, 1991, pp. 3155–3161, XP000268533, ISSN: 0734–211X.

* cited by examiner

Primary Examiner—S. Rosasco
(74) Attorney, Agent, or Firm—Farjami & Farjami LLP

(57) ABSTRACT

A resolution enhancement phase shift mask is disclosed. In one embodiment, a first clear region and second and third clear regions on each side of the first clear region and contiguous to the first clear region are used. All of the clear regions can be made of quartz. The second and third clear regions have an equal thickness. However, both the second and third clear regions are thinner than the first clear region. The difference in thickness between the first clear region and the second and third clear regions is calculated to cause a 180 degree phase shift in light passing through the second and third clear regions relative to light passing through the first clear region. The destructive interference caused at the phase boundaries of the first clear region and the second and third clear regions results in a dark unexposed area on the surface of an underlying photoresist layer; the dark unexposed area having geometry and dimensions corresponding to the geometry and dimensions of the first clear region. In this embodiment, a single mask, single exposure technique is used. The single mask comprises regions such as the first, second, and third clear regions referred to above for producing a desired image of small feature sizes on an underlying photoresist layer. For large features, an opaque material such as chrome can be used in the invention's mask.

25 Claims, 11 Drawing Sheets

Alternating Phase Shift Mask

Attenuated Phase Shift Mask

TRANSPARENT PHASE SHIFT MASK FOR FABRICATION OF SMALL FEATURE SIZES

BACKGROUND OF THE INVENTION

1. Field of the Invention

The present invention is in the field of fabricating semiconductor wafers. More particularly, the invention is in the field of photolithographic masks used to fabricate semiconductor wafers.

2. Background Art

Photolithography is used extensively in the semiconductor industry to form a desired pattern on the surface of a semiconductor wafer. Typically, the photolithographic process begins by coating the surface of a silicon wafer with photoresist. Conventionally, a "binary mask" having fully non-transmittive opaque regions made of chrome, and fully light transmittive transparent regions made of quartz, is then positioned over the surface of the photoresist coated wafer. Typically a lens system of a stepper is used to shine visible or ultra-violet light on the binary mask. This light passes through the transparent regions of the mask and exposes the corresponding regions of the underlying photoresist layer, and is blocked by the opaque regions of the mask, leaving the corresponding regions of the photoresist layer unexposed. The photoresist layer is then developed by chemical removal of the exposed or non-exposed regions (depending on whether a positive or a negative resist has been used). The end result is a silicon wafer and the desired pattern of photoresist thereon. This pattern can then be used for etching underlying regions of the silicon wafer.

A major shortcoming of the conventional binary mask is that it cannot be effectively used to pattern feature sizes which are substantially smaller than the exposure wavelength. For feature sizes smaller than the exposure wavelength, the use of the binary mask requires the maximum attainable numerical aperture of the lens system. However, as the numerical aperture is increased, the depth of field of the lens system is reduced. Since the surface of the silicon wafer is not optically flat, the reduction of depth of field of the lens system translates into poor focus in various regions of the silicon wafer. Thus, as the minimum feature size is reduced, the limits of the conventional binary mask are reached.

To overcome the limitations of the binary mask, one technique involves use of an "alternating phase shift mask." An example of an alternating phase shift mask is mask 102 in FIG. 1A. Referring to mask 102 in FIG. 1A, a fully opaque material such as chrome is used in region 106 of mask 102. Chrome region 106 is flanked by transparent regions 104 and 108. Transparent regions 104 and 108 are typically made of quartz. The thickness of quartz region 108 is approximately 2280 Angstroms less than that of quartz region 104. The thickness of region 108 is calculated such that light passing through region 108 has a phase shift of 180 degrees relative to light passing through the thicker region 104 which has no phase shift, i.e. a phase shift of 0 degrees.

The 180 degree phase shift induced in light passing through quartz region 108 results in destructive interference between light passing through quartz region 108 and that passing through quartz region 104. Graph 120 in FIG. 1A shows the approximate intensity of light under regions 104, 108, and 106. The opposite phases of light passing through the 0 degree phase shift region 104 and light passing through the 180 degree phase shift region 108 cancel, resulting in a dark unexposed region 116 on the surface of the photoresist coated wafer. As shown in FIG. 1A, the dark unexposed region 116 falls on an area of the photoresist layer which is located below chrome region 106.

Although small feature sizes can be patterned by using an alternating phase shift mask such as mask 102 in FIG. 1A, alternating phase shift masks have various shortcomings. For example, reference to graph 120 in FIG. 1A illustrates that the intensity of light passing through the 0 degree phase shift region 104 is greater (having peak 114) than the intensity of light passing through the 180 degree phase shift region 108 (having peak 112). The difference in intensity causes an unbalanced exposure of the photoresist layer such that areas of photoresist under mask region 108 are underexposed while areas of photoresist under mask region 104 are overexposed.

The above-described imbalance in intensity and image position of the conventional alternating phase shift mask is a great disadvantage and in an attempt to overcome this disadvantage a "dual trench" alternating phase shift mask has recently been devised. In the dual trench alternating phase shift mask, quartz from both regions 104 and 108 is etched to different depths so that, while maintaining the 180 degree phase shift of region 108 relative to region 104, the intensity of light under both regions 104 and 108 is almost equalized. However, the dual trench results in a shift in the center of focus of light passing through one trench with respect to the center of focus of light passing through the other trench. Moreover, the dual trench alternating phase shift mask is more difficult to manufacture since quartz from both regions 104 and 108 has to be etched to precise, but different, depths in order to balance the intensity of light passing through both regions 104 and 108.

Moreover, according to the dual trench alternating phase shift mask (and also the conventional alternating phase shift mask), the use of a first mask results in creation of artifacts at the boundaries between the 0 degree phase shift and the 180 degree phase shift regions. Accordingly, a second mask is required for a second exposure in order to erase the artifacts created by the first mask during the first exposure. The requirement that two masks (and two exposures) must be used increases the complexity of the photolithographic process, results in a need for an accurate alignment between the first and second exposures, reduces the throughput of processing the semiconductor wafer, and is more costly than a single mask, single exposure method.

A technique is disclosed in U.S. Pat. No. 5,858,580 to Wang et al utilizing a two-mask, two-exposure approach. A first "phase shift mask" consists of a "control chrome" that is flanked by 0 degree and 180 degree phase regions. Regions in the first mask other than the control chrome, 0 degree, and 180 degree phase regions are covered by a "phase shift mask chrome." A dark unexposed area under the "control chrome" is created at the phase boundaries of the 0 degree and 180 degree phase regions. A second "structure mask" is used to expose selected parts of the underlying photoresist that were unexposed due to the existence of the phase shift mask chrome in the first mask.

Another technique is disclosed in U.S. Pat. No. 5,573,890 to Spence utilizing a single mask method in which transition regions are used to compensate for artifacts that would have been produced if there were 0 degree to 180 degree transitions in the mask. Spence also discloses a two-mask, two-exposure approach where a first "phase shift and structure mask" consisting of adjacent 0 degree and 180 degree phase regions is used to create dark unexposed areas on the underlying photoresist. A second "trim mask" is then used to erase artifacts produced by the first mask.

A recent variation to the alternating phase shift method contemplates use of four different phases of light, i.e. use of regions causing a 0 degree phase shift, 60 degree phase shift, 120 degree phase shift, and 180 degree phase shift so that artifacts are not produced after the first exposure. Although this type of alternating phase shift technique uses a single mask and a single exposure, the need for four different phase regions makes this type of alternating phase shift mask extremely expensive to manufacture.

Another recent attempt to overcome the limitations of the binary mask in patterning small feature sizes is the "attenuated phase shift mask." FIG. 1B shows an attenuated phase shift mask 142. Regions 144 and 148 are made of a transparent material such as quartz. Transparent regions 144 and 148 have equal thickness and induce no phase shift in the light passing through them. Region 146 is made of a nearly opaque material such as MoSiON (Molybdenum Silicon Oxynitride) which transmits only 6% of the light shone thereon. The thickness and index of refraction value of the nearly opaque material in region 146 is such that it induces a phase shift of 180 degrees in the light passing through it. The destructive interference caused by light passing through the 0 degree phase shift regions 144 and 148 and light passing through the 180 degree phase shift region 146 results in a relatively dark area on a photoresist layer lying below mask 142.

However, because there is only a 6% transmission of the phase shifted light, the interference effect is reduced since only 6% of the phase shifted light performs destructive interference with light passing through the 0 phase shift regions. Thus, the image rendered on an underlying photoresist layer is not very sharp. Referring to graph 160 in FIG. 1B, it is noted that the difference between the intensity of light in relatively dark area 156 and the peak intensities at points 154 and 152 is not as great as the corresponding difference between the intensity of light in dark area 116 and the peak intensities at points 114 and 112 shown in graph 120 of FIG. 1A.

Another disadvantage of attenuated phase shift mask 142 is that an additional layer of a nearly opaque material such as MoSiON must be patterned and fabricated on attenuated phase shift mask 142 which results in added complications and expense of manufacturing the mask.

Accordingly, there is need in the art for a photolithographic mask to render a sharp image of minimum feature sizes with a balanced intensity of light and further to reduce the complexity and expense of manufacturing the photolithographic mask. There is also need in the art for a mask which can be utilized in a single exposure mode to reduce the complexity and expense of producing the desired exposure pattern on an underlying photoresist layer.

SUMMARY OF THE INVENTION

The present invention is a transparent phase shift mask for fabrication of small feature sizes. The invention overcomes the need in the art for a photolithographic mask for rendering sharp images of smallest feature sizes with a balanced intensity of light. The invention's resolution enhancement phase shift mask can be manufactured by using a simple process which results in a reduction in the complexity and expense of manufacturing photolithographic masks. Moreover, the invention can be used in a single mask, single exposure mode to reduce the complexity and expense of producing a desired exposure pattern on the underlying photoresist layer while increasing the throughput of the semiconductor wafer fabrication process.

In one embodiment, the invention comprises a first clear region and second and third clear regions on each side of the first clear region and contiguous to the first clear region. All of the clear regions can be made of quartz. The second and third clear regions have an equal thickness. However, both the second and third clear regions are thinner than the first clear region. The difference in thickness between the first clear region and the second and third clear regions is calculated to cause a 180 degree phase shift in light passing through the second and third clear regions relative to light passing through the first clear region. The destructive interference caused at the phase boundaries of the first clear region and the second and third clear regions results in a dark unexposed area on the surface of an underlying photoresist layer; the dark unexposed area having geometry and dimensions corresponding to the geometry and dimensions of the first clear region.

In this embodiment of the invention, a single mask, single exposure technique is used. The single mask comprises regions such as the first, second, and third clear regions referred to above for producing a desired image of small feature sizes on an underlying photoresist layer. For large features, an opaque material such as chrome can be used in the invention's mask.

DETAILED DESCRIPTION OF THE INVENTION

The present invention is a transparent phase shift mask for fabrication of small feature sizes. Although the invention is described with respect to specific embodiments, the principles of the invention, as defined by the claims appended herein, can obviously be applied beyond the specifically described embodiments of the invention described herein.

Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 2:
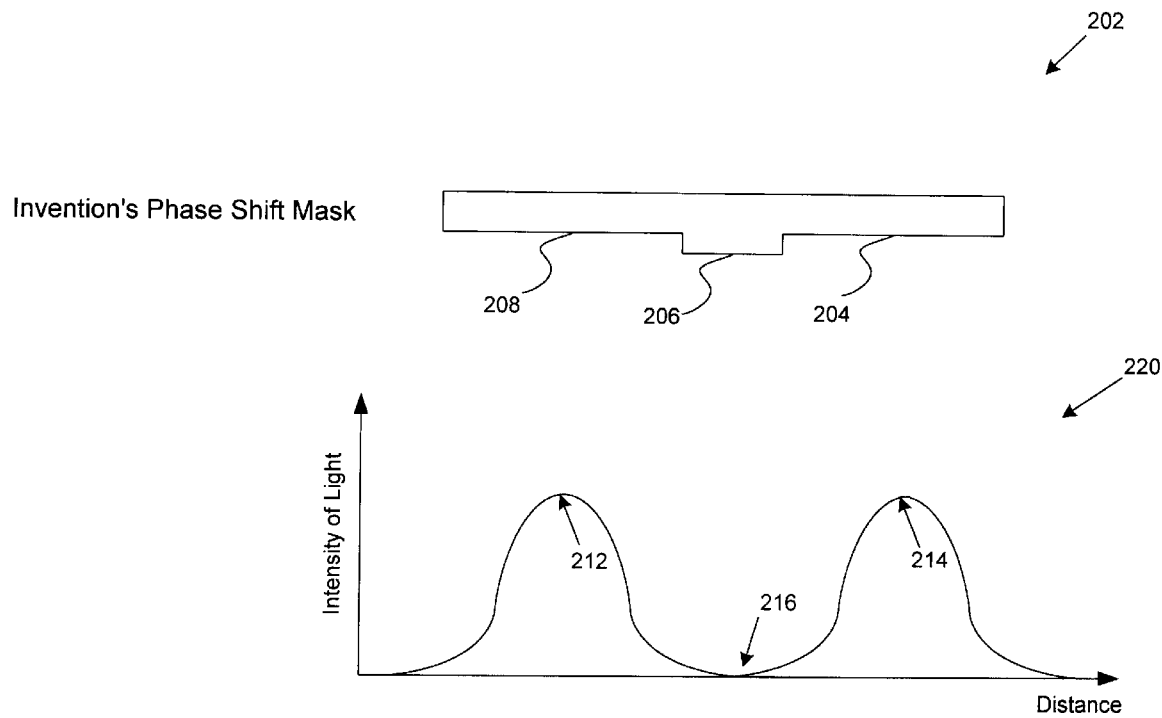
FIG. 2 shows the invention's phase shift mask and a graph of intensity of light corresponding to the invention's phase shift mask.

With respect to the specific embodiments of the invention described in the present application, reference is made to FIG. 2. FIG. 2 shows an embodiment of the resolution enhancement phase shift mask of the present invention referred to generally by numeral 202. A clear region 206 which is typically made of quartz is flanked by two contiguous clear regions 204 and 208 which are also typically made of quartz. As seen from FIG. 2, quartz region 206 is thicker than quartz regions 204 and 208. The thickness of quartz regions 204 and 208 is calculated to cause a 180 degree phase shift in light passing through regions 204 and 208. However, quartz region 206 does not cause any phase shift in light passing through it. In other words, quartz region 206 results in a 0 degree phase shift in light passing through it. Accordingly, there is a 180 degree phase difference between light passing through quartz region 206 relative to light passing through quartz regions 204 and 208. In the present application, regions such as quartz region 206 are also referred to as "non-phase shift" regions and regions such as quartz regions 204 and 208 are also referred to as "phase shift" regions.

Because of this 180 degree phase difference, there is destructive interference at the phase boundaries of the 180 degree phase shift regions 204 and 208 and the 0 degree phase shift region 206. As shown in graph 220 of FIG. 2, the destructive interference at the phase boundaries of regions 204 and 208 with region 206 results in a dark area 216 directly below region 206. As shown in graph 220, the intensity of light in dark area 216 is low while the intensity of light in the areas directly below regions 208 and 204 peaks at points 212 and 214.

Figure 3:
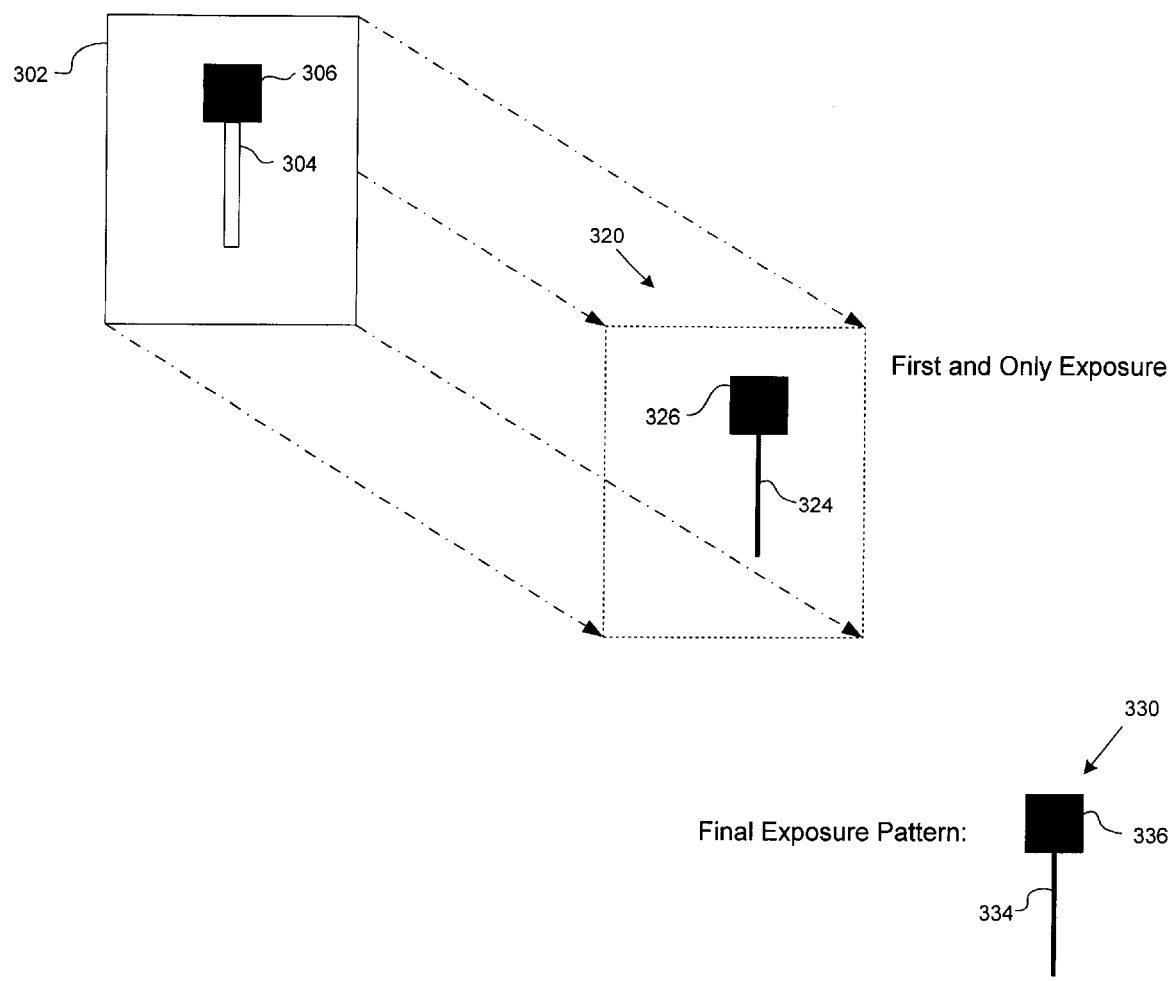
FIG. 3 shows an embodiment of the invention's single mask, single exposure technique and the resulting final exposure pattern.

As explained above, the present invention is used primarily to produce images for patterning smallest feature sizes in a semiconductor fabrication process which are typically transistor gates. By way of example, FIG. 3 illustrates an embodiment of the invention's resolution enhancement phase shift mask used for producing a desired exposure pattern on an underlying photoresist layer. In this example, the desired exposure pattern corresponds to a transistor gate of minimum width connected to a contact landing pad.

The invention's mask 300 in FIG. 3 is used to produce a dark line of minimum width and a relatively wide dark square on the surface of an underlying photoresist layer. The dark line of minimum width would ultimately be fabricated as a transistor gate of minimum width while the relatively wide dark square would ultimately be fabricated as a contact landing pad connected to the minimum width transistor gate. Thus, the final semiconductor structure would be a minimum width transistor gate connected to a relatively wide and square contact landing pad.

Discussing the invention's phase shift mask 300 in more detail, region 302 of mask 300 is a clear quartz region (having a 100% light transmission rate). Similarly, region 304 of mask 300 is a clear quartz region (also having a 100% light transmission rate). Region 302 is etched down to a depth of approximately 2280 Angstroms so as to induce a 180 degree phase shift in light passing through it. Region 304, which is approximately 2280 Angstroms thicker than region 302, does not cause any phase shift in light passing through it. Thus, there is a 180 degree phase shift in light passing through region 302 relative to light passing through region 304. Region 306 consists of a fully opaque material such as chrome which has a light transmission rate of 0%.

Image 320 in FIG. 3 is the image rendered on the surface of an underlying photoresist layer when light passes through mask 300. Image 320 comprises a dark line 324 which has a width equal to the minimum width for a transistor gate and equal to the smallest feature size in the semiconductor fabrication process used in this example. The width of dark line 324 in image 320 is, for example, 0.15 microns. In the manner explained above, dark line 324 in image 320 has geometry and dimensions that correspond to the geometry and dimensions of 0 degree phase shift region 304 in mask 300. Ultimately, a wafer region will be fabricated having geometry and dimensions that correspond to the geometry and dimensions of 0 degree phase shift region 304 in mask 300.

Image 320 also comprises a dark square 326 which is connected to dark line 324. Final exposure pattern 330 is the pattern that would be the final resulting photoresist pattern. Final exposure pattern 330 comprises thin line 334 of minimum width corresponding to a transistor gate of minimum width, which in the present example is 0.15 microns. Final exposure pattern 330 also includes square contact region 336 which is connected to thin line 334.

It is noted that according to the embodiment of the invention's resolution enhancement phase shift mask 300 in FIG. 3, the invention's mask is used to pattern the underlying photoresist layer in a single exposure. Destructive interference of light at phase boundaries between regions 302 and 304 of phase shift mask 300 results in creation of a dark unexposed line 324 on the photoresist layer. Since it is desired that the width of line 324 be very small, for example 0.15 microns, it is not possible to achieve such a small width using conventional techniques such as those using a chrome pattern to block light. However, dark square region 326 is wide enough to be created using conventional techniques by using chrome region 306 in mask 300.

Thus, resolution enhancement phase shift mask 300 of the present invention combines the conventional binary mask technique of using chrome to create wider unexposed areas with the invention's unique phase shift technique utilizing thick and thin quartz regions to create thin unexposed areas on an underlying photoresist layer. The combination of binary mask technique and the invention's unique phase shift technique thus creates a final exposure pattern having both wide areas and areas of minimum width. It is again noted that in the embodiment of the invention described in this example, a single exposure is required to arrive at the final exposure pattern on the photoresist layer, i.e. final exposure pattern 330 comprising dark square 336 and minimum width line 334.

Figure 4:
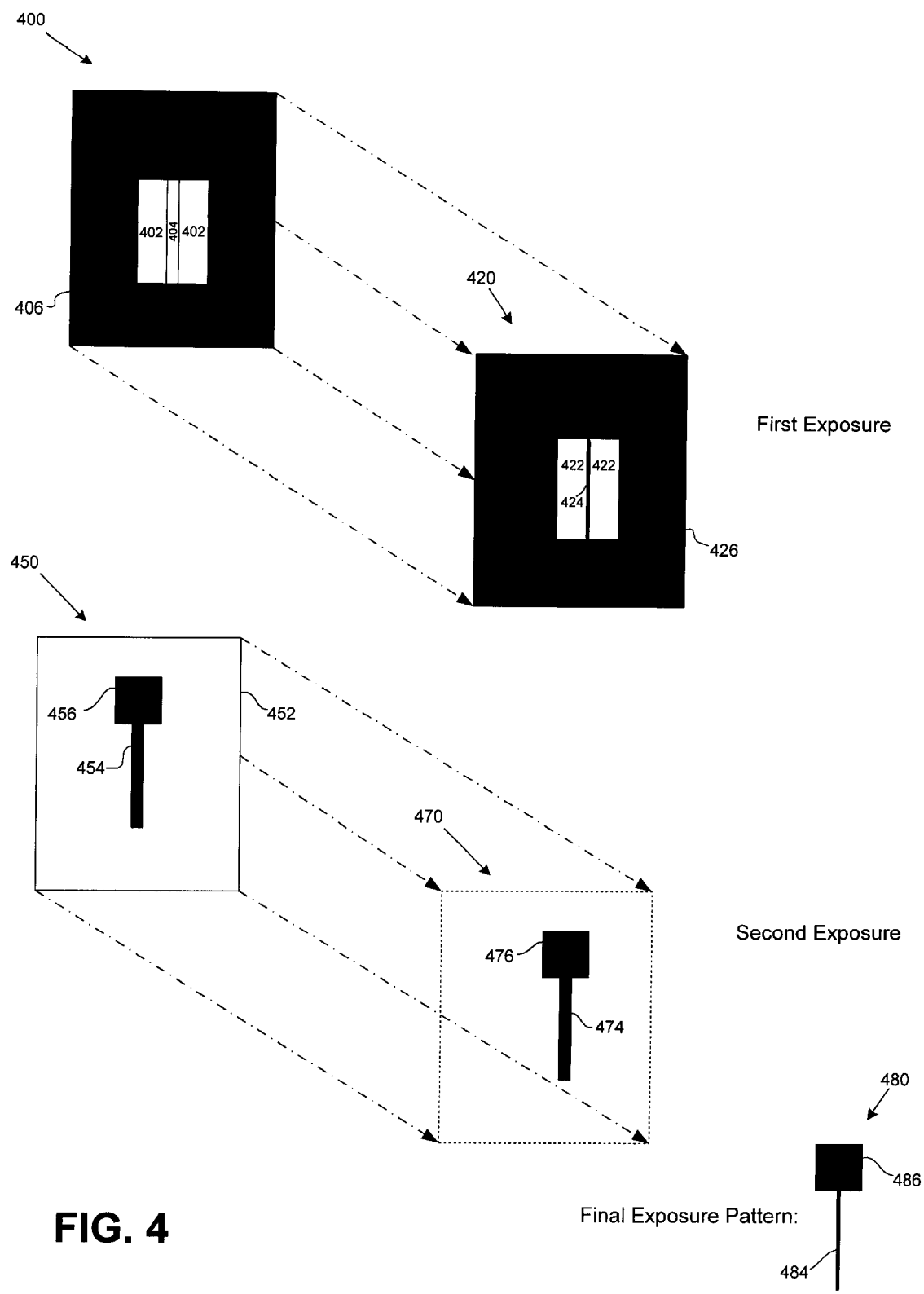
FIG. 4 shows an embodiment of the invention's two-mask, two-exposure technique and the resulting final exposure pattern.

In another embodiment of the invention, the invention's phase shift technique is used to arrive at a final exposure pattern using a two-mask, two-exposure technique (as opposed to the single exposure embodiment described above). FIG. 4 illustrates the two-mask embodiment of the invention. At the outset it is noted that final exposure pattern 480 in FIG. 4 which is the result of the two-exposure embodiment of the invention is the same as final exposure pattern 330 in FIG. 3 which was the result of the single exposure embodiment of the present invention.

Referring to FIG. 4, regions 402 of mask 400 are clear regions (having a 100% light transmission rate) which are typically made of quartz. Similarly, region 404 of mask 400 is a clear region (also having a 100% light transmission rate) typically made of quartz. Regions 402 are etched down to a depth of approximately 2280 Angstroms so as to induce a 180 degree phase shift in the light passing through them. Region 404, which is approximately 2280 Angstroms thicker than regions 402, does not cause any phase shift in the light passing through it. Region 406 consists of a fully opaque material such as chrome which has a light transmission rate of 0%.

Image 420 in FIG. 4 is the image rendered on the surface of an underlying photoresist layer when light passes through phase shift mask 400. Image 420 is comprised of a dark thin line 424 which has a width equal to the minimum width for a transistor gate and equal to the smallest feature size in the semiconductor fabrication process used in this example. The width of dark line 424 in image 420 is, for example, 0.15 microns. Image 420 also includes areas 422 which are completely exposed to light passing through mask 400. Image 420 further includes area 426 which is dark and not exposed to light due to presence of chrome region 406 in mask 400.

As seen from image 426 in FIG. 4, mask 400 results in an exposure pattern having thin line 424 which corresponds to the transistor gate to be ultimately fabricated on the silicon wafer. However, image 426 does not include the exposure pattern corresponding to the contact to be fabricated. The exposure pattern for the contact landing pad is achieved by performing an exposure using mask 450 in FIG. 4. Mask 450 comprises region 452 which is a clear region typically made of quartz and which induces no phase shift in the light passing through it. Regions 454 and 456 consist of a fully opaque material such as chrome which has a light transmission rate of 0%.

Image 470 in FIG. 4 is the image rendered on the surface of the underlying photoresist layer when light passes through mask 450. Image 470 is comprised of a dark rectangular area 474 and a dark square area 476 which are not exposed to light due to presence of chrome regions 454 and 456 in mask 450. Final exposure pattern 480 is the result of the two exposures through masks 400 and 450. As seen in final exposure pattern 480, the only unexposed areas of the photoresist layer are thin line 484 and square 486. All other areas of the photoresist layer have been exposed by either the first or the second exposures using, respectively, masks 400 and 450.

In other words, during the first exposure using mask 400, region 426 and thin line 424 were not exposed to light while regions 422 were exposed to light. During the second exposure using mask 450, chrome region 454 ensures that line 424 which was unexposed during the first exposure would remain unexposed. However, with the exception of line 424 which had not been exposed to light, the remaining areas under chrome region 454 have already been exposed to light during the first exposure using mask 400. During the second exposure using mask 450, square chrome region 456 prevents exposure of the underlying photoresist corresponding to square area 486 in final exposure pattern 480.

As stated above, the resulting exposure pattern after the dual exposure using masks 400 and 450 is final exposure pattern 480. Final exposure pattern 480 consists of dark square area 486 which is contiguous to dark line 484. Final exposure pattern 480 is the pattern that would be the final resulting photoresist pattern. Final exposure pattern 480 comprises a thin line 484 of minimum width corresponding to a transistor gate of minimum width, which in the present example is 0.15 microns. Final exposure pattern 480 also includes square contact region 486 which is connected to thin line 484.

It is noted that according to this embodiment of the invention, destructive interference of light at phase boundaries between regions 402 and 404 of mask 400 results in creation of a dark unexposed line 484 on the photoresist layer. Since it is desired that the width of line 484 be very small, for example 0.15 microns, it is not possible to achieve such a small width using conventional techniques such as using chrome on quartz. However, dark square region 486 is wide enough to be created using conventional techniques by using chrome region 456 in mask 450. Thus, resolution enhancement phase shift mask of the present invention combines the conventional binary mask technique of using chrome to create wider unexposed areas with the invention's unique phase shift technique utilizing thick and thin quartz regions to create thin unexposed areas on an underlying photoresist layer. The combination of binary mask technique and the invention's unique phase shift technique thus creates a final exposure pattern having both wide areas and areas of minimum width. It is noted that in the embodiment of the invention described above, a dual exposure is required to arrive at the final exposure pattern of the photoresist layer, i.e. final exposure pattern 480 comprising square 486 and minimum width line 484.

Figure 5A:
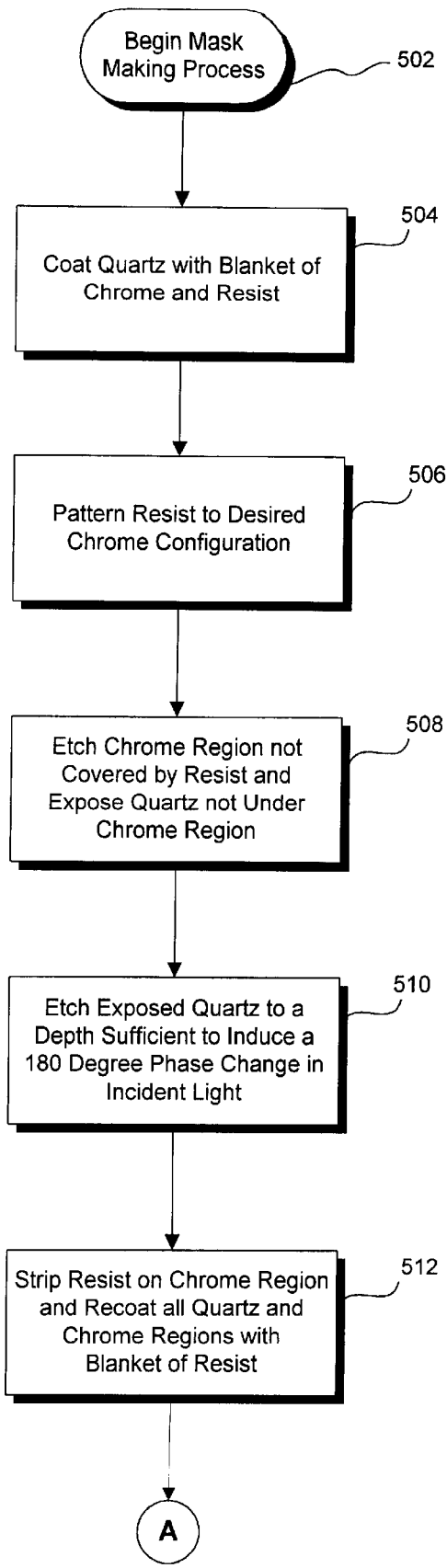
FIGS. 5A and 5B are flow charts illustrating a process for making the invention's mask.
Figure 5B:
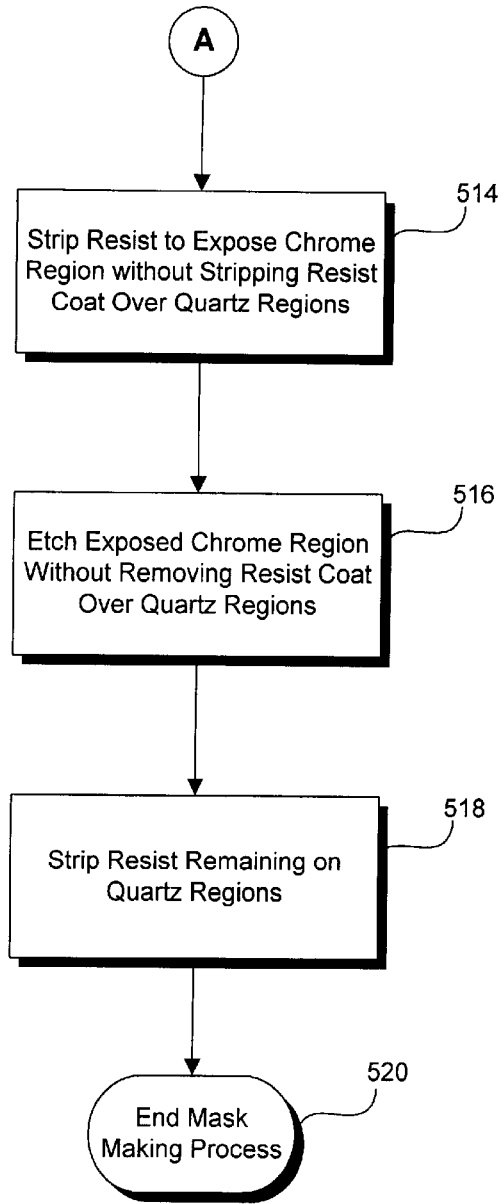
Figure 6A:
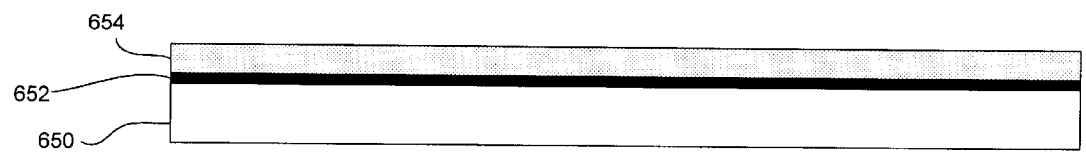
FIGS. 6A and 6B illustrate the resulting structure after the performance of each step in the flow charts of FIGS. 5A and 5B.
Figure 6A:
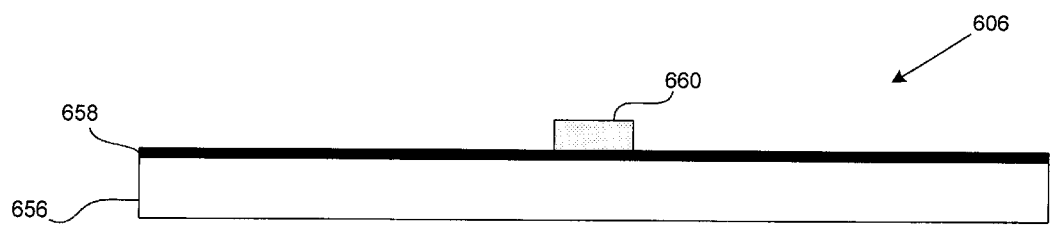
Figure 6A:
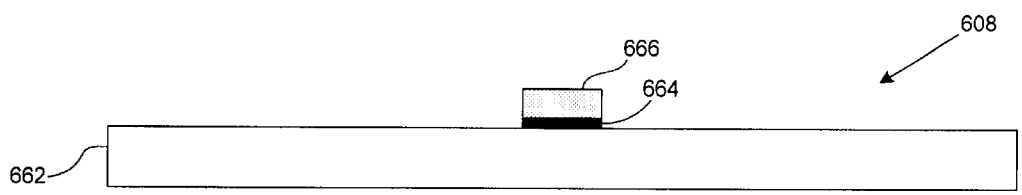
Figure 6A:
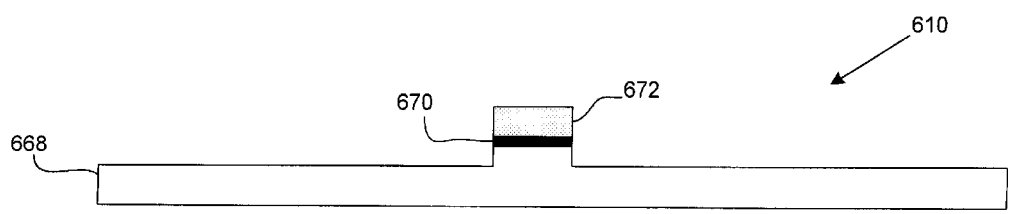
Figure 6B:
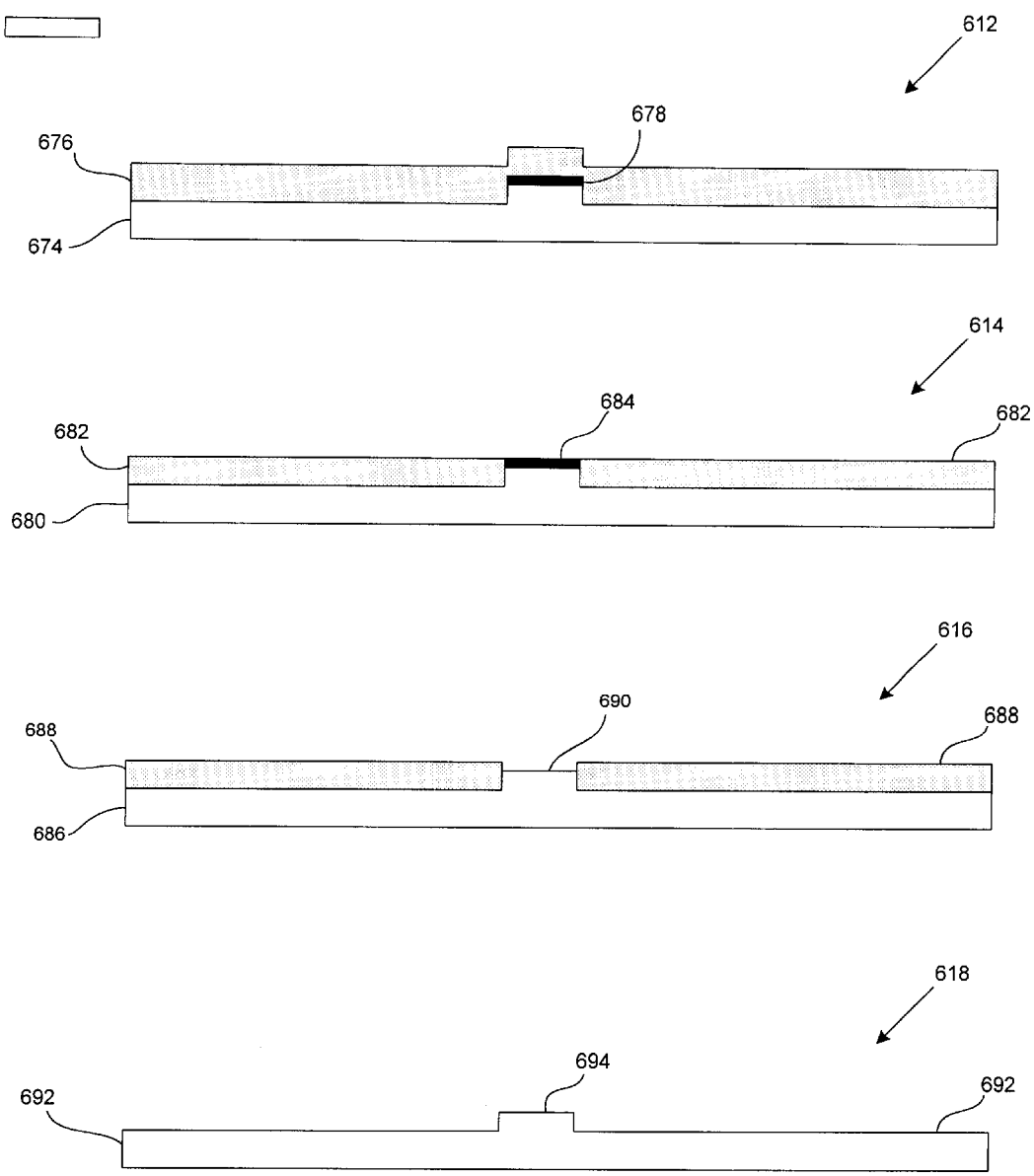

The flow charts in FIGS. 5A and 5B illustrate the invention's process for making the resolution enhancement phase shift mask. Referring to FIG. 5A, the process of making the invention's phase shift mask begins at step 502. At step 504, a blank quartz plate of uniform thickness is coated with a layer of chrome of uniform thickness which is in turn coated with a layer of photoresist of uniform thickness (it is noted that "photoresist" is also referred to as "resist" in the present application). FIGS. 6A and 6B illustrate the structure resulting from each respective step of the flow charts in Figures 5A and 5B. Referring to FIG. 6A, structure 604 is the resulting structure after step 504. As shown in FIG. 6A, structure 604 comprises a quartz plate 650 covered by a layer of chrome 652 and a layer of photoresist 654.

At step 506 (FIG. 5A) the photoresist layer is exposed, developed, and removed from the chrome layer except from those regions where chrome is to remain. The resulting structure 606 (FIG. 6A) shows photoresist region 660 covering chrome layer 658 which in turn covers quartz plate 656. At step 508 (FIG. 5A), with the exception of the chrome region covered by the photoresist, the remaining regions of the chrome layer are etched away. The resulting structure 608 (FIG. 6A) comprises photoresist region 666 over chrome region 664. Quartz plate 662 remains intact; however, with the exception of the quartz region covered by chrome region 664 and photoresist region 666, other regions of quartz plate 662 will be exposed to subsequent etching. In the present application, regions such as photoresist region 666 and chrome region 664 in structure 608 are also referred to as regions "designating" the 0 degree phase shift regions in the quartz plate.

At step 510 (FIG. 5A), those regions of the quartz plate that are not protected by the remaining photoresist region are etched to a depth sufficient to produce a 180 degree phase shift in light passing therethrough. As stated above, the depth sufficient for producing the 180 degree phase shift is approximately 2280 Angstroms. Structure 610 in FIG. 6A is the resulting structure after step 510. As shown in structure 610, quartz plate 668 is etched everywhere except for the quartz region covered by photoresist region 672 and chrome region 670. As stated above, the region of quartz plate 668 that is etched, i.e. the region that is not protected by photoresist region 672 and chrome region 670, will induce a phase shift of 180 degrees in light passing through it.

At step 512 (FIG. 5A), the photoresist remaining on the chrome region is first stripped and then the entire quartz plate and the chrome region remaining on the quartz plate are covered with a blanket of photoresist. Structure 612 in FIG. 6B is the result of this step. As shown in structure 612, the entire quartz plate 674 and chrome region 678 are covered by photoresist layer 676. At step 514 (FIG. 5B), the photoresist region covering the chrome region is exposed and developed while other regions of photoresist remain intact. Structure 614 in FIG. 6B is the result of this step. As shown in structure 614, chrome region 684 is exposed while photoresist regions 682 cover quartz plate 680.

At step 516 (FIG. 6B), the exposed chrome region is etched away without etching the photoresist regions covering the quartz plate. The result of this step is shown as structure 616 in FIG. 6B. As shown in structure 616, quartz plate 686 is covered by photoresist regions 688. Quartz region 690 has a thickness that is about 2280 Angstroms greater than the thickness of the remaining regions of quartz plate 686. At step 518 (FIG. 6B), the photoresist remaining on the quartz plate is stripped. Structure 618 (FIG. 6B) is the resulting structure after completion of step 518. Structure 618 comprises thin quartz regions 692 and thick quartz region 694. As stated above, thin quartz regions 692 induce a 180 degree phase shift in light passing therethrough relative to thick quartz region 694. At step 520 (FIG. 5B), the process of making a phase shift mask according to the present invention ends. Structure 618 is therefore the final photolithographic mask that is used to pattern photoresist on the surface of a semiconductor wafer.

Figure 1A:
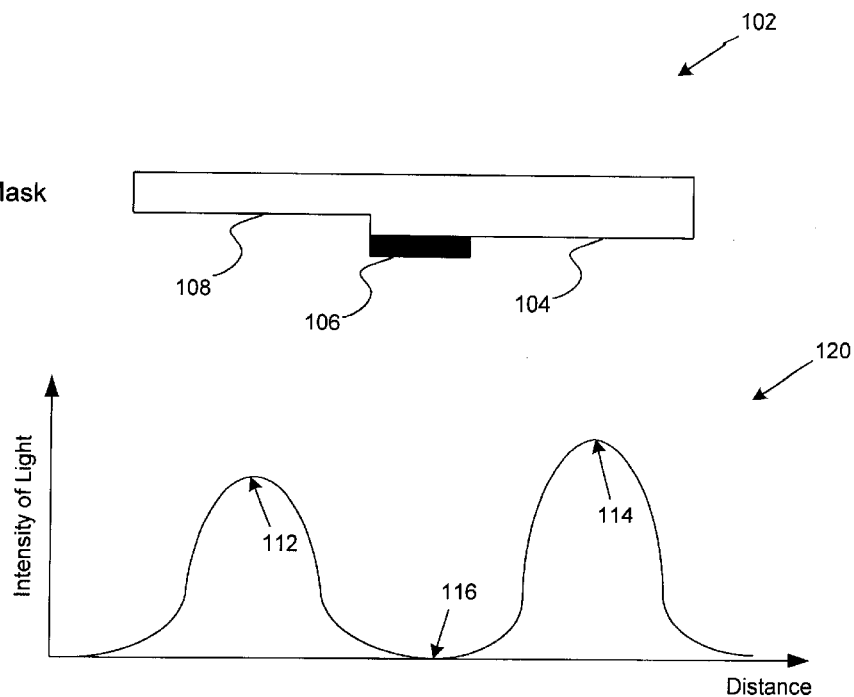
FIG. 1A shows a prior art alternating phase shift mask and a graph of intensity of light corresponding to the alternating phase shift mask.
Figure 1B:
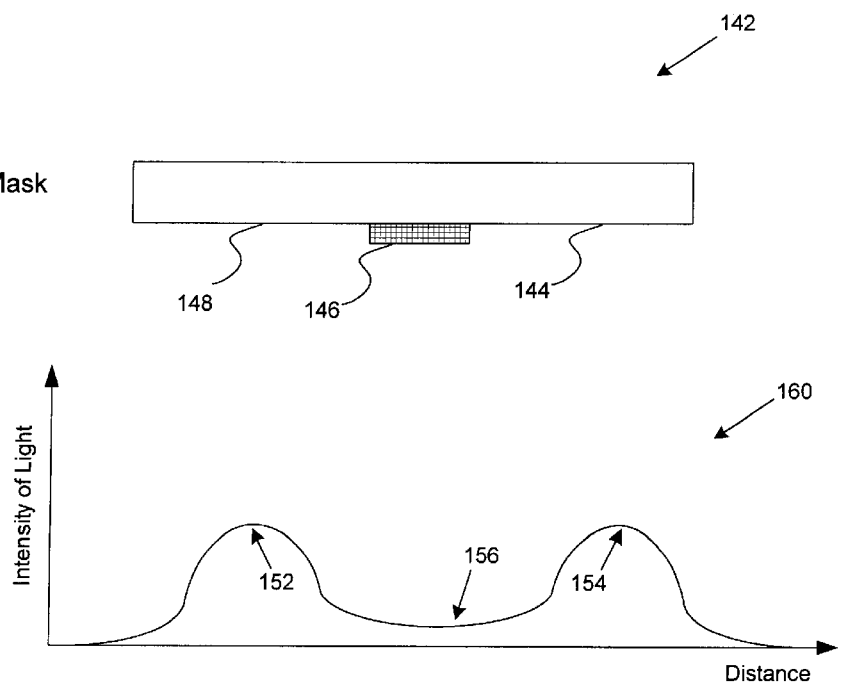
FIG. 1B shows a prior art attenuated phase shift mask and a graph of intensity of light corresponding to the attenuated phase shift mask.

The invention's resolution enhancement phase shift mask described above presents several advantages over the conventional phase shift masks such as the attenuated phase shift mask shown in FIG. 1B and the alternating phase shift mask shown in FIG. 1A. With respect to the attenuated phase shift mask shown in FIG. 11B, the invention has a number of advantages. For example, one of the advantages of the invention's phase shift mask over the attenuated phase shift mask of FIG. 11B is that the invention results in improved sidewall angles when patterning photoresist on the surface of the semiconductor wafer. Sidewall angle is a measure of the steepness of the angle formed between an unexposed area and an adjacent exposed area of the photoresist.

The invention's phase shift mask achieves an improved sidewall angle since the image rendered by the invention's phase shift mask on the surface of the photoresist is much sharper compared to the image rendered by a conventional attenuated phase shift mask. Comparing graph 160 in FIG. 1B with graph 220 in FIG. 2, it is apparent that the difference between the intensity of light in relatively dark area 156 and the peak intensities at points 154 and 152 in graph 160 is not as great as the corresponding difference between the intensity of light in dark area 216 and the peak intensities at points 214 and 212 shown in graph 220 of FIG. 2. The greater difference between peak intensity and low intensity points in the image produced by the invention's phase shift mask means that the image produced by the invention's phase shift mask is sharper than that produced by the conventional attenuated phase shift mask. The sharper image in turn results in an improved sidewall angle.

Figure 7:
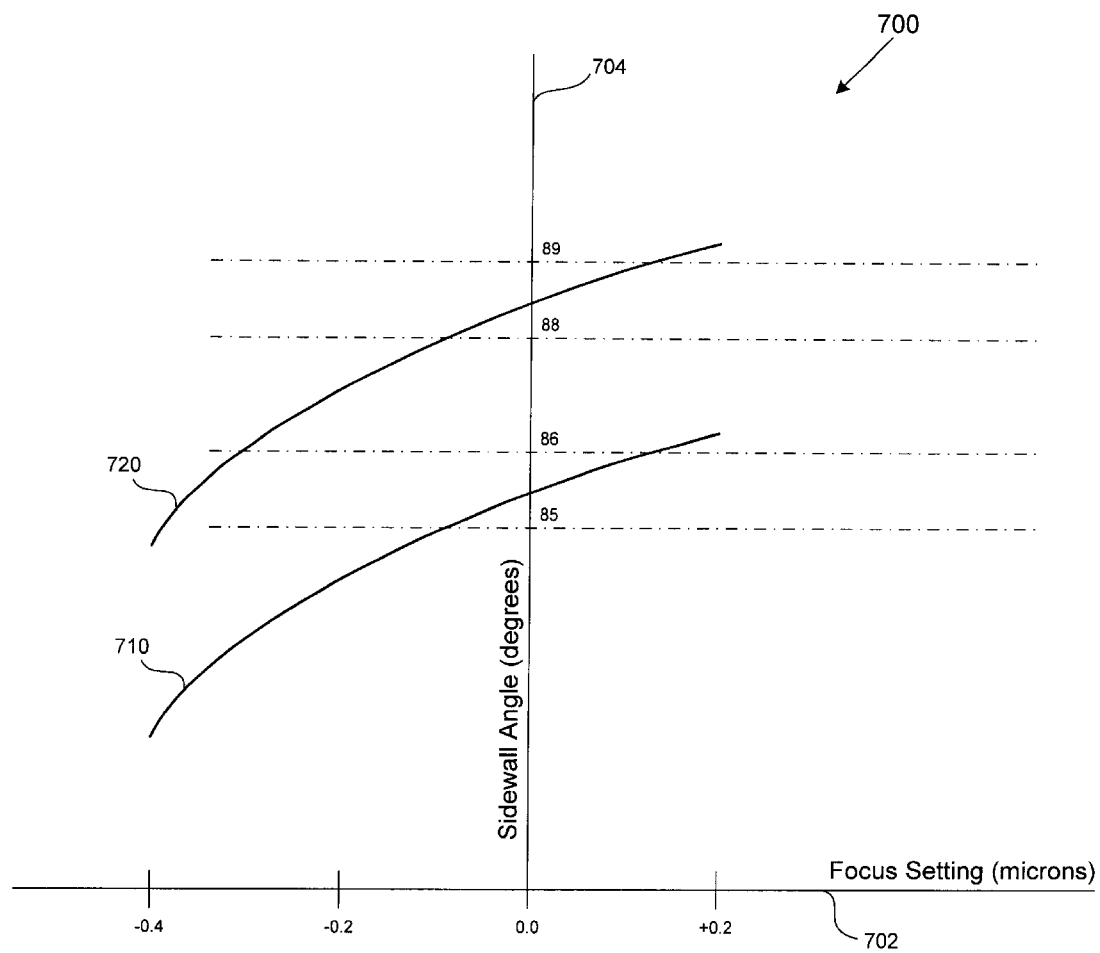
FIG. 7 is a graph comparing the photoresist pattern sidewall angle when the invention's mask is used with the photoresist pattern sidewall angle when an attenuated phase shift mask is used.

Graph 700 in FIG. 7 shows the difference in sidewall angles achieved by the invention's phase shift mask compared to that achieved by a conventional attenuated phase shift mask such as that shown in FIG. 1B. In graph 700, x-axis 702 corresponds to various focus settings and y-axis 704 corresponds to the resulting sidewall angles. Curve 720 represents the sidewall angles achieved by the invention's phase shift mask at various focus settings while curve 710 represents the sidewall angles achieved by a conventional attenuated phase shift mask. As seen from graph 700, the invention achieves higher sidewall angles at all focus settings compared with the sidewall angles achieved by a conventional attenuated phase shift mask. For example, at the focus setting of 0.0 microns, the sidewall angle achieved by the invention is approximately 88.5 degrees compared to approximately 85.5 degrees achieved by a conventional attenuated phase shift mask.

Another advance achieved by the invention compared to attenuated phase shift mask 142 of FIG. 1B is a significant reduction in photoresist loss. One measure of an effective photolithographic mask is the amount of photoresist loss when producing a photoresist pattern. As the image produced by the mask increases in sharpness, i.e. as the difference between the intensity of light in dark (unexposed) areas and the intensity of light in bright (exposed) areas on the photoresist layer increases, the photoresist areas to be etched out and those areas to remain unetched will be more clearly defined. As the boundary between exposed and unexposed areas on the photoresist layer becomes more clearly defined, the "rounding off" of the photoresist at the boundary of exposed and unexposed areas is reduced. In other words, there is less photoresist loss due to the rounding off effect.

The adverse effects of photoresist loss are more damaging and noticeable when the photoresist layer is very thin. Thinner photoresist layers are desirable as smallest feature sizes to be fabricated on the semiconductor wafer decrease. Thinner layers of photoresist result in a higher resolution of photoresist pattern which can be used to fabricate smaller geometries on the semiconductor wafer. However, the rounding off effect caused by attenuated phase shift masks, such as mask 142 of FIG. 1B, lessens usefulness of very thin photoresist layers. The reason is that the adverse effects of photoresist loss result in a smaller usable depth of focus. Accordingly, the invention's advance in reducing the amount of photoresist loss is more significant when thinner photoresist layers are used.

Figure 8:
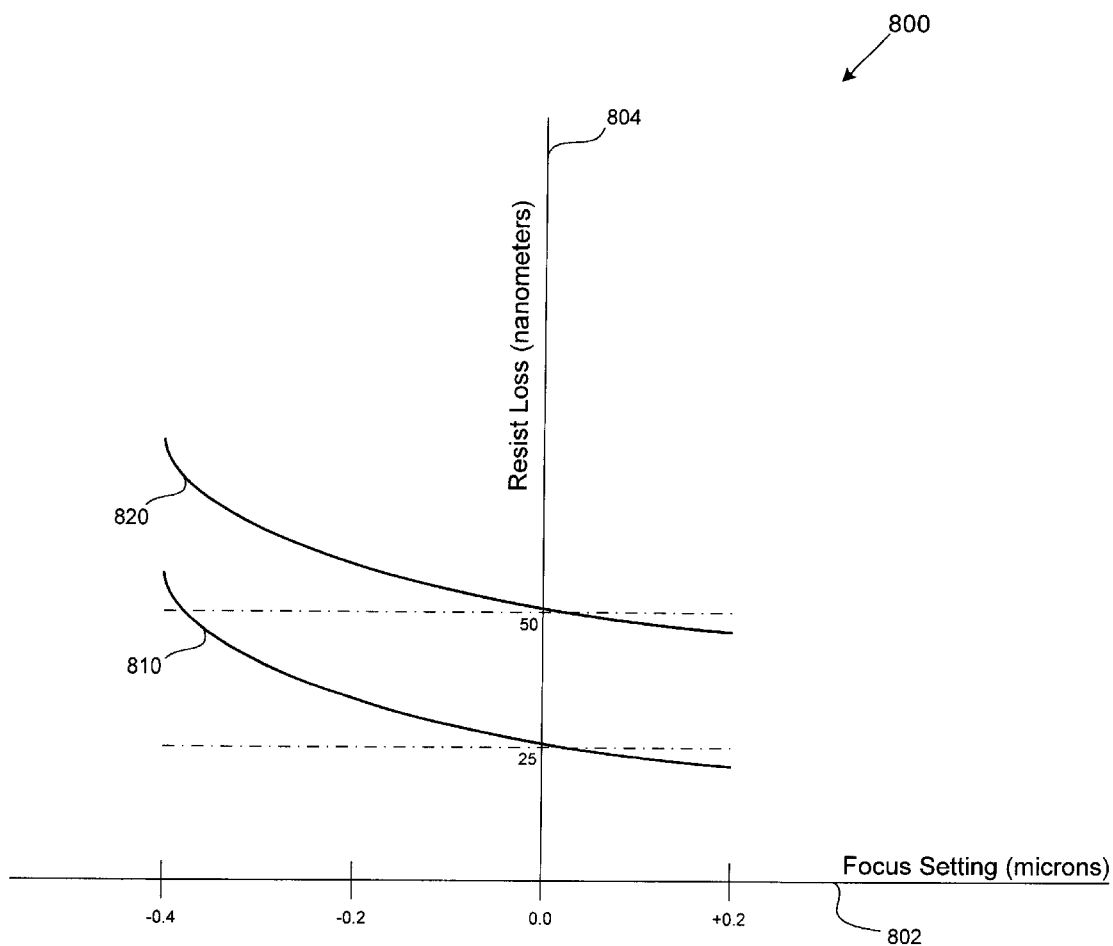
FIG. 8 is a graph comparing photoresist loss when the invention's mask is used with photoresist loss when an attenuated phase shift mask is used.

Graph 800 in FIG. 8 illustrates the substantial reduction of photoresist loss achieved by the present invention. As shown in graph 800, x-axis 802 corresponds to the focus setting while y-axis 804 corresponds to the amount of photoresist loss. Curve 820 shows the amount of photoresist loss at various focus settings for a conventional attenuated phase shift mask such as that shown in FIG. 1B. Curve 810 shows the amount of photoresist loss at various focus settings for the invention's phase shift mask. As an example, at a focus setting of 0.0 microns, approximately 50 nanometers of photoresist is lost from the photoresist layer when a conventional attenuated phase shift mask is used. Considering the fact that a typical photoresist layer has a thickness of approximately 440 nanometers, the loss of 50 nanometers is a significant loss. In contrast, the invention's phase shift mask results in merely 25 nanometers of photoresist loss at a focus setting of 0.0 microns. Thus, as shown in graph 800 of FIG. 8, the invention results in a significant reduction of photoresist loss.

Figure 9:
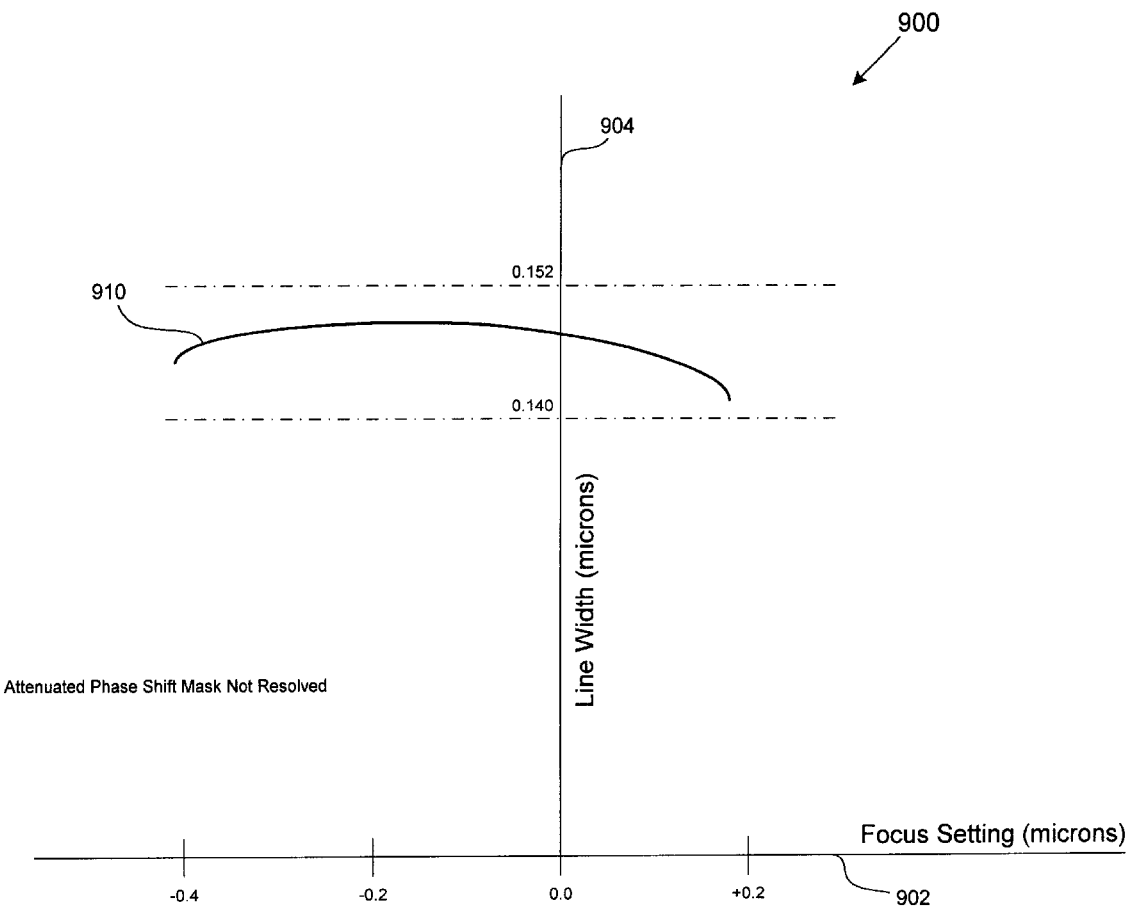
FIG. 9 is a graph illustrating the depth of focus achieved by the invention's mask for a pitch of 0.37 microns.

Graph 900 in FIG. 9 illustrates another advantage of the invention's phase shift mask over a conventional attenuated phase shift mask such as that shown in FIG. 1B. In graph 900 of FIG. 9, x-axis 902 corresponds to the focus setting while y-axis 904 corresponds to line width. Graph 900 shows the consistent line width achieved when it is desired to resolve a pitch of 0.37 microns with the invention's phase shift mask. "Pitch" refers to the distance between the centers of two neighboring lines. Thus, a pitch of 0.37 microns refers to the distance in microns between the centers of two (parallel and neighboring) lines to be patterned on the semiconductor die.

Curve 910 in graph 900 shows the line width achieved by the invention's resolution enhancement phase shift mask. As shown by curve 910, the invention's phase shift mask resolves a pitch of 0.37 microns at various focus settings with a line width between approximately 0.140 and 0.152 microns. However, with an attenuated phase shift mask such as that shown in FIG. 1B (i.e. an attenuated phase shift mask with a 6% transmission rate), a pitch of 0.37 microns cannot be resolved at all. In other words, it is not possible to achieve a focus and distinguish two neighboring lines whose centers are separated by 0.37 microns.

The invention's phase shift mask also has distinct advantages over alternating phase shift mask 102 of FIG. 1A. As discussed earlier in the present application, alternating phase shift mask 102 of FIG. 1A has an "intensity and image position imbalance" that must be fixed with the dual trench approach discussed above. The fabrication of a dual trench alternating phase shift mask is, however, complicated and expensive. Another disadvantage of the dual trench alternating phase shift mask (which is also a disadvantage of a conventional alternating phase shift mask) is that a two-mask method, also called a double exposure method, must be used to produce the final desired exposure pattern on the surface of the photoresist.

According to the dual trench alternating phase shift mask (or the conventional alternating phase shift mask), the use of a single mask results in creation of artifacts at the boundaries between the 0 degree phase shift and the 180 degree phase shift regions. Accordingly, a second mask is required for a second exposure in order to erase the artifacts created by the first mask during the first exposure. The requirement that two masks and two exposures must be used increases the complexity of the process, results in the need for an accurate alignment between the first and second exposures, reduces the throughput of processing the semiconductor wafer, and is more costly than the single mask, single exposure method of the present invention.

A recent variation to the alternating phase shift method contemplates use of four different phases of light, i.e. use of different regions causing a 0 degree phase shift, 60 degree phase shift, 120 degree phase shift, and 180 degree phase shift in an attempt to prevent creation of artifacts after the first exposure. Although this type of alternating phase shift method is a single mask, single exposure method, the mask is extremely expensive to manufacture.

Another advantage of the invention's phase shift mask is the fact that it can exhibit a significantly lower mask error factor ("MEF") compared to either the alternating phase shift mask (such as mask 102 shown in FIG. 1A) or the attenuated phase shift mask (such as mask 142 shown in FIG. 1B). The mask error factor or MEF is an indication of how much the mask would magnify (or reduce) an error in the size of the smallest feature sizes, i.e. an error in the width of lines that are supposed to have the minimum width in a semiconductor fabrication process.

For example, suppose that a particular semiconductor fabrication process has a minimum line width of 0.15 microns. Suppose further that a photolithographic mask is to expose the photoresist on the surface of the semiconductor wafer in a manner that an image having a width of 0.15 microns is produced which would ultimately result in a line on the semiconductor wafer with a width of 0.15 microns. If such an image is to be produced at two different locations on the photoresist, the mask pattern which is to produce the 0.15 micron image may be sized perfectly at the first location while the mask pattern which is to produce the 0.15 micron image at the second location may be oversized by, for example, 10%. If the MEF is equal to 1.0, the image produced on the surface of photoresist at the second location would be 10% larger than the image produced on the surface of photoresist at the first location. In other words, the image produced for the first line would have a width of 0.150 microns while the image produced for the second line would have a width of 0.165 microns.

If the MEF is equal to 2.0, the 10% error on the mask is magnified such that the image on the photoresist layer corresponding to the second line would be 20% wider than the image corresponding to the first line. In other words, the image produced for the first line would have a width of 0.150 microns while the image produced for the second line would have a width of 0.180 microns. On the other hand, if the MEF is equal to 0.5, the image produced on the surface of photoresist would be only 5% larger for the second line. In other words, the image produced for the first line would have a width of 0.150 microns while the image produced for the second line would have a width of 0.1575 microns. Manifestly, a small MEF is desirable to accurately image minimum widths on the surface of the photoresist and in fact to compensate for undesired variations (i.e. errors) in the width of small feature sizes on the mask. Thus, an MEF of 0.5 in fact compensates for undesired errors on the mask and results in better uniformity in the size of small features on the photoresist layer.

The phase shift mask of the present invention can achieve an MEF of approximately 0.1. In other words, the invention's phase shift mask actually results in a dramatic reduction of the effects of any errors on the mask itself. In contrast, an alternating phase shift mask such as mask 102 in FIG. 1A typically achieves an MEF of approximately 0.5 while an attenuated phase shift mask such as mask 142 in FIG. 1B has an MEF that is considerably greater than 0.5.

As described above, the present invention has overcome the need in the art for a photolithographic mask for rendering sharp images of smallest feature sizes with a balanced intensity of light. The invention's resolution enhancement phase shift mask can be manufactured by using a simple process which results in a reduction in the complexity and expense of manufacturing photolithographic masks. Moreover, the invention can be used in a single mask, single exposure mode to reduce the complexity and expense of producing a desired exposure pattern on the underlying photoresist layer while increasing the throughput of the semiconductor wafer fabrication process.

It is noted that although the invention was described with respect to specific embodiments, the principles of the invention, as defined by the claims appended herein, can obviously be applied beyond the specifically described embodiments of the invention described herein. For example, in the present application quartz was used as an exemplary material for clear regions of the mask and chrome was used as an exemplary material for opaque regions of the mask. However, a substantially clear material other than quartz and a substantially opaque material other than chrome may be used without departing from the scope of the present invention as disclosed and claimed in the present application. Thus, a transparent phase shift mask for fabrication of small feature sizes has been described.

What is claimed is:

1. A mask comprising:
   an opaque region;
   a first clear region, said first clear region being adjacent to said opaque region;
   a second clear region contiguous to a first side of said first clear region, said second clear region causing a phase shift in light passing through said second clear region by 180 degrees relative to a phase of light passing through said first clear region;
   a third clear region contiguous to a second side of said first clear region, said third clear region causing a phase shift in light passing through said third clear region by 180 degrees relative to said phase of light passing through said first clear region; said first, second, and third clear regions causing destructive interference of light passing through said first, second, and third clear regions.

2. The mask of claim 1 wherein said first clear region is a rectangle having first and second long sides and first and second short sides, and wherein said first long side is said first side of said first clear region and said second long side is said second side of said first clear region.

3. The mask of claim 2 wherein said first and second short sides of said rectangle are substantially equal to a smallest feature size in a semiconductor fabrication process.

4. The mask of claim 1 wherein said destructive interference of light passing through said first, second, and third regions produces an image corresponding to a first geometry and a first plurality of dimensions of said first region.

5. The mask of claim 4 wherein said image is a line having a width equal to a smallest feature size in a semiconductor fabrication process.

6. The mask of claim 1 wherein said first, second, and third regions are made of quartz.

7. The mask of claim 1 wherein said opaque region comprises chrome.

8. A method for making a mask, said method comprising the steps of:
   forming an opaque region;
   designating a first clear region as a region of 0 degree phase shift, said first clear region having a first geometry and a first plurality of dimensions, said first clear region being adjacent to said opaque region, said first clear region and said opaque region being surrounded by a second clear region designated as a region of 180 degree phase shift;
   reducing a thickness of said second clear region so as to cause light passing through said second clear region to undergo a phase shift of 180 degrees relative to light passing through said first clear region;
   said first and second clear regions causing destructive interference of said light passing through said first and second clear regions.

9. The method of claim 8 wherein said designating step comprises depositing and patterning a layer of photoresist so as to cause photoresist having substantially said first geometry and said first plurality of dimensions to remain on said mask.

10. The method of claim 8 wherein said first and second clear regions are made of quartz.

11. The mask of claim 8 wherein said opaque region comprises chrome.

12. A method for making a mask, said method comprising the steps of:
   depositing a layer comprised of a substantially opaque material on a plate of substantially clear material;
   designating a first region of said layer as corresponding to a non-phase shift region on said plate, designating a second region of said layer as corresponding to a phase shift region on said plate, and designating a third region of said layer as an opaque region on said plate;
   etching said layer so as to cause said substantially opaque material to be removed from said second region of said layer;
   reducing a thickness of said plate of substantially clear material in said phase shift region of said plate;
   removing said substantially opaque material from said first region of said layer;
   said phase shift and non-phase shift regions causing destructive interference of light passing through said phase shift and non-phase shift regions.

13. The method of claim 12 wherein said second region of said layer is contiguous to and surrounds said first region and said third region.

14. The method of claim 12 wherein said substantially opaque material is comprised of chrome.

15. The method of claim 12 wherein said substantially clear material is comprised of quartz.

16. The method of claim 12 wherein said phase shift region causes a phase shift of 180 degrees in light passing through said phase shift region.

17. The method of claim 12 wherein said non-phase shift region is a rectangle having first and second long sides and first and second short sides, and wherein said first and second short sides of said rectangle are substantially equal to a smallest feature size in a semiconductor fabrication process.

18. The method of claim 12 wherein said destructive interference of light passing through said phase shift and non-phase shift regions produces an image corresponding to a first geometry and a first plurality of dimensions of said non-phase shift region.

19. The method of claim 18 wherein said image is a line having a width substantially equal to a smallest feature size in a semiconductor fabrication process.

20. A method of using a mask, said method comprising the steps of:
   creating a first image in a first exposure using a first mask, said first image including an unexposed line, first and second exposed regions, and an unexposed region, said unexposed line caused by destructive interference of light passing through first and second clear phase shift regions and a clear non-phase shift region of said first mask, said first and second exposed regions, respectively, corresponding to first and second clear phase shifts regions of said first mask, said unexposed region corresponding to an opaque region of said first mask;
   creating a second image in a second exposure using a second mask, said second image including first and second unexposed regions, said first unexposed region corresponding to a first opaque region of said second mask, said first unexposed region of said second image being situated within said unexposed region of said first image, said second unexposed region corresponding to a second opaque region of said second mask, said second unexposed region of said second image covering said unexposed line of said first image;
   said first and second exposures forming a pattern, said pattern including said first unexposed region of said second image and said unexposed line of said first image.

21. The method of claim 20 wherein said pattern is formed on a layer of photoresist situated on a semiconductor wafer.

22. The method of claim 20 wherein said unexposed line corresponds to a geometry and a plurality of dimensions of said clear non-phase shift region.

23. The method of claim 20 wherein said first and second clear phase shift regions cause a phase shift of 180 degrees in light passing through said first and second clear phase shift regions.

24. The method of claim 20 wherein said first and second clear phase shift regions and said clear non-phase shift region are comprised of quartz.

25. The method of claim 20 wherein said opaque region of said first mask and said first and second opaque regions of said second mask are comprised of chrome.

\* \* \* \* \*